US010206309B2

United States Patent
Yang et al.

(10) Patent No.: US 10,206,309 B2
(45) Date of Patent: Feb. 12, 2019

(54) ELECTRONIC CONTROL APPARATUS FOR VEHICLE

(71) Applicant: Hyundai Autron Co., Ltd., Seongnam-si (KR)

(72) Inventors: Sun Jae Yang, Gunpo-si (KR); Hyung Joon Moon, Seoul (KR); Chang Geun Shin, Yongin-si (KR); Dong Gi Lee, Incheon (KR); Seung Mok Song, Seongnam-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 80 days.

(21) Appl. No.: 14/139,850

(22) Filed: Dec. 23, 2013

(65) Prior Publication Data

US 2014/0334104 A1    Nov. 13, 2014

(30) Foreign Application Priority Data

May 10, 2013 (KR) ........................ 10-2013-0053195

(51) Int. Cl.
*H05K 7/20* (2006.01)
*H05K 1/02* (2006.01)
*H05K 5/00* (2006.01)

(52) U.S. Cl.
CPC ....... *H05K 7/20454* (2013.01); *H05K 5/0047* (2013.01); *H05K 7/2039* (2013.01);
(Continued)

(58) Field of Classification Search
CPC .... H05K 7/20; H05K 7/2039; H05K 7/20436; H05K 7/20445; H05K 7/20454;
(Continued)

(56) References Cited

U.S. PATENT DOCUMENTS 5,177,669 A * 1/1993 Juskey ................ H01L 23/3107
                                                    174/16.3
5,467,251 A * 11/1995 Katchmar ........... H01L 23/3672
                                                    174/252
(Continued)

FOREIGN PATENT DOCUMENTS

CN      1321337 A     11/2001
CN    101312626 A     11/2008
(Continued)

OTHER PUBLICATIONS

Office Action, Korea Intellectual Property Office, dated May 1, 2014.

(Continued)

*Primary Examiner* — Zachary Pape
(74) *Attorney, Agent, or Firm* — Baker McKenzie; Harry Park (57) ABSTRACT

The present disclosure relates to an electronic control apparatus for a vehicle, and the electronic control apparatus includes: an electronic control board which has a top side on which a heating element is mounted; a heat sink which radiate heat generated from the heating element to the outside; at least one screw which couples the electronic control board and the heat sink; and a heat radiating pad which transfer heat of the heating element to the heat sink, in which a stepped portion having a predetermined depth is formed on the contact surface of the heat sink so that the heat radiating pad is inserted thereto, and the depth of the stepped portion is formed to be smaller than a thickness of the heat radiating pad so that the heat radiating pad is pressed and inserted between the electronic control board and the heat sink.

5 Claims, 6 Drawing Sheets

(52) U.S. Cl.
CPC ..... *H05K 7/20436* (2013.01); *H05K 7/20854* (2013.01); *H05K 1/0204* (2013.01); *H05K 7/20472* (2013.01)

(58) Field of Classification Search
CPC ............... H05K 7/205; H05K 7/20845; H05K 7/20854; H05K 1/0204–1/0206; H02K 11/0073; H02K 3/50; H02K 2203/03
USPC .......... 361/679.54, 696, 697, 698, 699, 700, 361/701, 702, 709–710, 715, 719
See application file for complete search history.

(56) References Cited

U.S. PATENT DOCUMENTS

| | | | | |
|---|---|---|---|---|
| 5,661,902 | A * | 9/1997 | Katchmar | H01L 23/3672 174/252 |
| 5,987,740 | A * | 11/1999 | Andrus | H05K 3/284 174/16.3 |
| 6,212,074 | B1 | 4/2001 | Gonsalves et al. | |
| 6,549,411 | B1 * | 4/2003 | Herbert | H01L 23/367 257/E23.102 |
| 7,023,699 | B2 | 4/2006 | Glovatsky | H05K 7/20454 165/185 |
| 7,031,165 | B2 * | 4/2006 | Itabashi | H05K 1/0206 174/252 |
| 7,057,896 | B2 * | 6/2006 | Matsuo | H01L 23/24 257/706 |
| 7,120,030 | B2 * | 10/2006 | Azumi | B60R 16/0239 361/752 |
| 7,543,960 | B2 * | 6/2009 | Chang | B82Y 10/00 362/294 |
| 8,393,757 | B2 * | 3/2013 | Uemoto | F21V 14/02 165/185 |
| 8,797,742 | B2 * | 8/2014 | Kawai | H05K 7/20854 361/704 |
| 8,926,139 | B2 * | 1/2015 | Reed | F21K 9/13 315/117 |
| 9,013,877 | B2 * | 4/2015 | Harubeppu | H01L 23/34 165/80.1 |
| 2002/0096767 | A1 * | 7/2002 | Cote | H01L 23/055 257/738 |
| 2003/0184969 | A1 | 10/2003 | Itabashi et al. | |
| 2003/0227750 | A1 | 12/2003 | Glovatsky et al. | |
| 2004/0080042 | A1 | 4/2004 | Macomber et al. | |
| 2006/0171127 | A1 * | 8/2006 | Kadoya | B29C 45/14377 361/752 |
| 2009/0086171 | A1 * | 4/2009 | Sun | H04N 9/3144 353/52 |
| 2009/0244899 | A1 * | 10/2009 | Chyn | F21V 29/004 362/294 |
| 2010/0090577 | A1 * | 4/2010 | Reed | F21V 29/004 313/46 |
| 2010/0277917 | A1 * | 11/2010 | Shan | F21V 15/01 362/249.02 |
| 2011/0228498 | A1 * | 9/2011 | Kawai | H05K 7/20854 361/752 |
| 2011/0317428 | A1 * | 12/2011 | Paik | F21K 9/137 362/294 |
| 2012/0048511 | A1 * | 3/2012 | Moshtagh | F21V 29/83 165/80.2 |
| 2012/0307476 | A1 * | 12/2012 | Masuzawa | H02K 11/33 361/816 |
| 2013/0003306 | A1 * | 1/2013 | Oota | B60R 16/0239 361/709 |
| 2013/0045569 | A1 * | 2/2013 | Koyanagi | H01L 21/568 438/107 |
| 2013/0250521 | A1 * | 9/2013 | Kawai | H05K 7/20854 361/714 |
| 2014/0247609 | A1 * | 9/2014 | Chen | F21K 9/90 362/373 |
| 2014/0265743 | A1 * | 9/2014 | Chamberlin | H02K 11/0073 310/68 D |

FOREIGN PATENT DOCUMENTS

| | | | |
|---|---|---|---|
| CN | 101987602 A | 3/2011 | |
| CN | 202210917 U | 5/2012 | |
| CN | 103021877 A | 4/2013 | |
| DE | 19541925 A1 * | 5/1997 | ......... B60R 16/0239 |
| EP | 2 290 685 A1 | 3/2011 | |
| JP | 11-307968 A | 11/1999 | |
| JP | 2007084040 A | 4/2007 | |

OTHER PUBLICATIONS

State Intellectual Property Office of the P.R.C., Office Action for Chinese patent application No. 201310705472.2, dated Jul. 19, 2016, China.

\* cited by examiner

| TYPICAL PROPERTIES OF GAP PAD 1500R ||||
|---|---|---|---|
| PROPERTY | IMPERIAL VALUE | METRIC VALUE | TEST METHOD |
| COLOR | Black | Black | Visual |
| Reinforcement Carrier | Fiberglass | Fiberglass | — |
| Thickness (inch)/(mm) | 0.010 to 0.020 | 0.254 to 0.508 | ASTM D374 |
| Inherent Surface Tack (I side) | 2 | 2 | — |
| Density (Bulk Rubber) (g/cc) | 2.1 | 2.1 | ASTM D792 |
| Heat Capacity (J/g-K) | 1.3 | 1.3 | ASTM E1269 |
| Hardness (Bulk Rubber (Shore 00) (1) | 40 | 40 | ASTM D2240 |
| Young's Modulus (pis)/(kPa)(2) | 45 | 310 | ASTM D575 |
| continuous Use Temp (°F/(°c) | -76 to 392 | -60 to 200 | — |
| ELECTRICAL ||||
| Dielectric Breakdown Voltage (Vac) | > 6000 | > 6000 | ASTM D149 |
| Dielectric Constant (1000 Hz) | 6.0 | 6.0 | ASTM D150 |
| Volume Resistivity (Ohm-metter) | 10 | 10 | ASTM D257 |
| Flame Rating | V-O | V-O | U.L. 94 |
| THERMAL ||||
| Thermal Conductivity (W/m-K) | 1.5 | 1.5 | ASTM D5470 |
| THERMAL PERFORMANCE vs STBAIN ||||
| Deflection (% strain) | 10 | 20 | 30 |
| Thermal Impedance (°C-in$^2$/W) 0.020 $^m$(3) | 1.07 | 0.88 | 0.82 |

FIG. 5

| Sample | Thermal Performance C/Watt | | | | | Thickness, mil |
|---|---|---|---|---|---|---|
| | 10psi | 25psi | 50psi | 100psi | 200psi | |
| LB2000.025 lot# A210-91-4, sample 1 | 4.12 | 3.94 | 3.70 | 3.44 | 3.17 | 23.9 |
| LB2000.025 lot# A210-91-4, sample 2 | 4.21 | 3.99 | 3.73 | 3.47 | 3.28 | 24.6 |
| LB2000.025 lot# A210-91-4, sample 3 | 4.17 | 3.99 | 3.77 | 3.57 | 3.40 | 25.2 |
| AVERAGE LB2000.025 lot# A210-91-4 | 4.17 | 3.97 | 3.73 | 3.49 | 3.28 | 24.6 |
| STDEV LB2000.025 lot# A210-91-4 | 0.05 | 0.03 | 0.04 | 0.07 | 0.12 | 0.7 |
| DOW 1-4173.020, sample 1 | 3.56 | 3.46 | 3.36 | 3.25 | 3.07 | 20.6 |
| DOW 1-4173.020, sample 2 | 3.69 | 3.50 | 3.34 | 3.16 | 3.02 | 20.7 |
| DOW 1-4173.020, sample 3 | 3.80 | 3.67 | 3.51 | 3.32 | 3.16 | 20.3 |
| AVERAGE DOW 1-4173.020 | 3.68 | 3.53 | 3.40 | 3.24 | 3.08 | 20.5 |
| STDEV DOW 1-4173.020 | 0.12 | 0.11 | 0.09 | 0.08 | 0.07 | 0.2 |

ELECTRONIC CONTROL APPARATUS FOR VEHICLE

CROSS-REFERENCE TO RELATED APPLICATIONS

This application is based on and claims priority from Korean Patent Application No. 10-2013-0053195, filed on May 10, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus which is an electronic control apparatus such as an engine electronic control unit (ECU) for a vehicle and has heating elements with improved heat radiating performance.

BACKGROUND

In general, an electronic control apparatus such as an ECU, which electronically controls various types of devices, is equipped in a vehicle. The electronic control apparatus receives information from sensors or switches that are installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

Heating elements are provided on a top side of the PCB, and a heat radiating pad is attached to a bottom side of the PCB. The cover and the base are fastened by a screw.

The heating elements such as capacitors, transistors, or various types of ICs are mounted on the top side of the PCB, and heat is generated from the elements depending on operations of the elements. In this case, the heat radiating pad having excellent thermal conductivity is attached to the bottom side of the PCB so as to radiate the generated heat to the outside. When the heat radiating function of the heating elements is not smoothly performed, the element may be abnormally operated and durability of components may deteriorate due to the generated heat, and the electronic control apparatus may be abnormally operated.

SUMMARY

The present disclosure has been made in an effort to provide an electronic control apparatus for a vehicle having excellent heat radiating performance. The present disclosure has been made in an effort to provide an electronic control apparatus for a vehicle in which a heat radiating pad, which has excellent assembly property and durability and only one surface of which has adhesive force, may be used.

An exemplary embodiment of the present disclosure provides an electronic control apparatus including: an electronic control board which has a top side on which a heating element is mounted, and electrically controls each part of a vehicle; a heat sink which is positioned on a bottom side of the electronic control board, absorbs heat generated from the heating element, and radiates the heat to the outside; at least one screw which couples the electronic control board and the heat sink; and a heat radiating pad which is inserted between the bottom side of the electronic control board and a contact surface of the heat sink, and transfers heat of the heating element to the heat sink, in which a stepped portion having a predetermined depth is formed on the contact surface of the heat sink so that the heat radiating pad is inserted thereto, and the depth of the stepped portion is formed to be smaller than a thickness of the heat radiating pad so that the heat radiating pad is pressed and inserted between the electronic control board and the heat sink.

The stepped portion of the heat sink may be formed so that a height of the contact surface to which the heat radiating pad is inserted is smaller than a height of one side surface which is coupled to the electronic control board by the screw.

Only one surface of the heat radiating pad may have adhesive force.

Another exemplary embodiment of the present disclosure provides an electronic control apparatus including: an electronic control board which has a top side on which a heating element is mounted, and electrically controls each part of a vehicle; a heat sink which is positioned on a bottom side of the electronic control board, absorbs heat generated from the heating element, and radiates the heat to the outside; at least one coupling member which couples the electronic control board and the heat sink; and a heat radiating member which is formed between the bottom side of the electronic control board and a contact surface of the heat sink, in which a stepped portion having a predetermined depth is formed on the contact surface of the heat sink, which faces the bottom side of the electronic control board on which the heating element is positioned, so as to include the heat radiating member, and a height of the stepped portion is formed to be smaller than a thickness of the heat radiating member so that the heat radiating member is inserted between the electronic control board and the heat sink while forming pressing force.

The coupling member may be a screw or a clip.

The heat radiating member may be heat radiating paste or liquid type glue.

According to the exemplary embodiment of the present disclosure, the heat radiating pad is pressed and inserted between the electronic control board and the heat sink, thereby providing the electronic control apparatus for a vehicle having excellent heat radiating performance.

The heat radiating pad is pressed and inserted, thereby using the heat radiating pad, which has excellent assembly property and durability and only one surface of which has adhesive force.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments according to the present disclosure will be described in detail with reference to the accompanying drawings. A configuration of the present disclosure and an operation and an effect according to the configuration of the present disclosure will be clearly understood by the detailed description below. In the following description, the same elements will be designated by the same reference numerals although the elements are illustrated in different drawings, and a detailed explanation of publicly known related configurations may be omitted so as to avoid unnecessarily obscuring the subject matter of the present disclosure.

Figure 1:
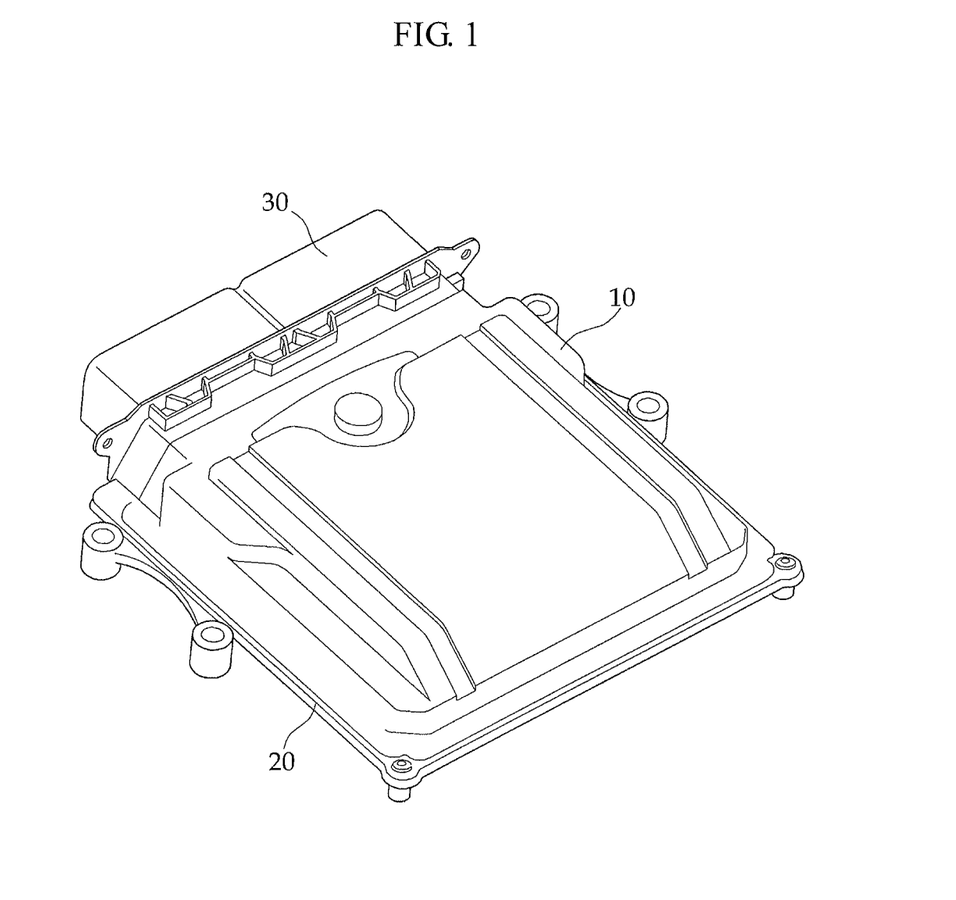
FIG. 1 is a coupled perspective view of an electronic control apparatus for a vehicle according to an exemplary embodiment of the present disclosure.

FIG. 1 is a coupled perspective view of an electronic control apparatus for a vehicle according to an exemplary embodiment of the present disclosure.

As illustrated, the electronic control apparatus refers to a component having an electronic control element, for example, integrated control circuit means, such as a printed circuit board (PCB), which electrically controls each part of a vehicle, and requires a tight sealing structure so as to prevent external moisture or foreign substances from flowing into the electronic control apparatus.

To this end, a cover 10 and a base 20, which are combined with each other in an up and down direction while accommodating a board such as the PCB therein, are provided, and a connector 30 is coupled to front portions of the cover 10 and the base 20 which are combined as described above. The connector 30 is coupled together with the cover 10 and the base 20 while being interposed between the cover 10 and the base 20 through a rear end body portion when the cover 10 and the base 20 are coupled to each other in the up and down direction.

As illustrated in FIG. 1, the electronic control apparatus refers to the component having the electronic control element, for example, integrated control circuit means, such as the PCB, which electrically controls each part of the vehicle, and requires a heat radiating structure for radiating heat, which is generated from heating elements such as capacitors mounted on the PCB, to the outside.

Figure 2:
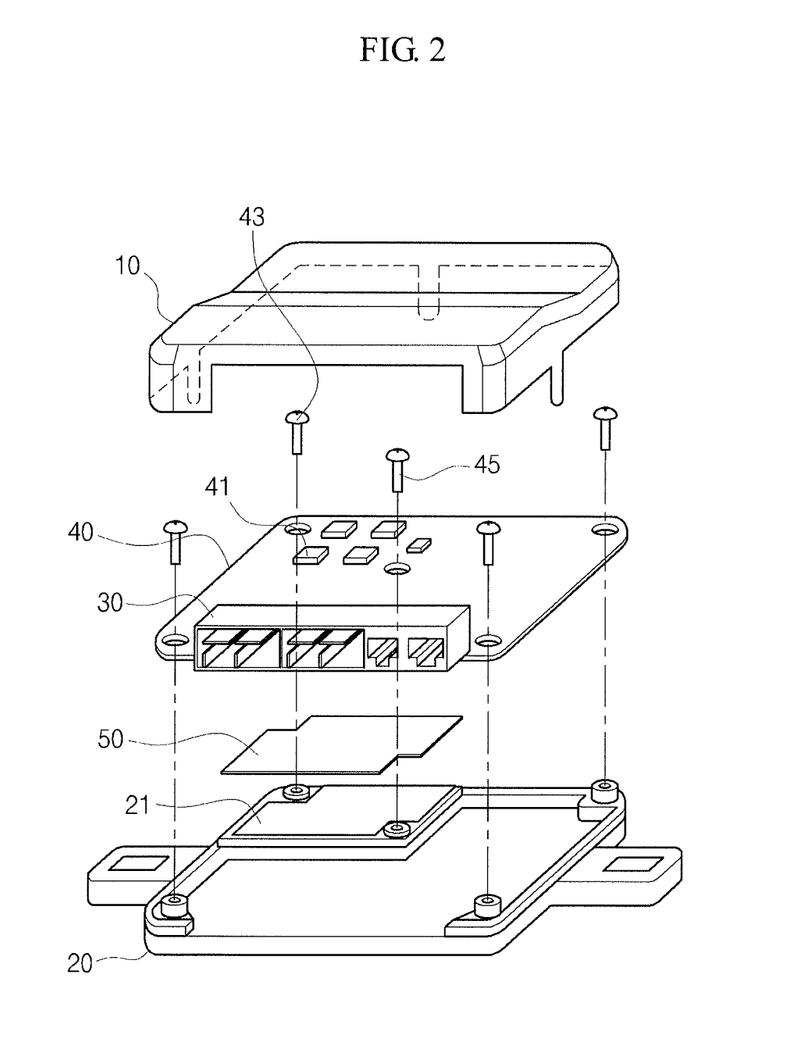
FIG. 2 is an exploded perspective view of the electronic control apparatus for a vehicle according to the exemplary embodiment of the present disclosure.

FIG. 2 is an exploded perspective view of the electronic control apparatus for a vehicle according to the exemplary embodiment of the present disclosure.

As described above with reference to FIG. 1, an electronic control board 40, which includes the electronic control element that electrically controls each part of the vehicle, is accommodated between the cover 10 and the base 20. Heating elements 41 such as capacitors, transistors, and ICs are mounted on a top side of the electronic control board 40. In order to radiate heat generated by the heating elements 41, a heat radiating pad 50, which is made of a conductive material, is inserted between a bottom side of the electronic control board 40 and the base 20. Therefore, the heat generated by the heating elements 41 is conducted to the electronic control board 40 and the heat radiating pad 50, and conducted to the base 20 at a lower side, such that a heat radiating mechanism is formed. In this case, both surfaces of the heat radiating pad 50 are configured to have adhesive force such that the heat radiating pad 50 is tightly fixed to the bottom side of the electronic control board 40 and a contact surface of a heat sink 21 of the base. The heat radiating pad 50 is inserted while being pressed, such that thermal conductivity may be improved, and torque of screws 43 and 45 illustrated may be adjusted such that a predetermined pressure is formed between the electronic control board 40 and the heat sink 21. However, the structure as illustrated in FIG. 2 has a structural limit when forming pressing force against the heat radiating pad 50 using the screws 43 and 45, and there is a limitation in that both surfaces of the heat radiating pad needs to have adhesive force so that the heat radiating pad is tightly fixed to the electronic control board 40 and the heat sink 21. In a case in which the electronic control apparatus is configured to have the structure as illustrated in FIG. 2, a process of attaching the heat radiating pad 50 to an accurate position and a process of separately fastening the screws are additionally required. Because it is substantially impossible to form uniform torque when the screws 43 and 45 are fastened, there is a drawback in that it is impossible for a designer to always maintain desired thermal conductivity to a predetermined level.

FIGS. 3A to 3D are a cross-sectional views illustrating the electronic control apparatus for a vehicle according to the exemplary embodiment of the present disclosure.

Figure 3A:
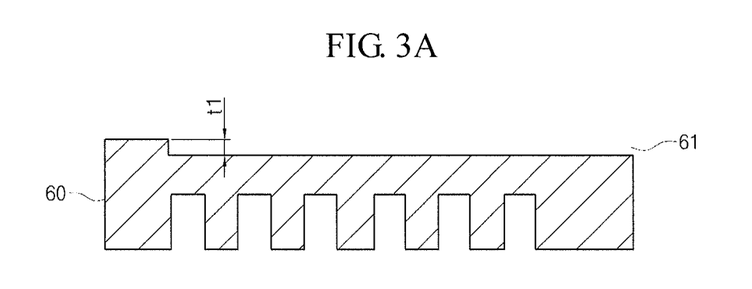
FIGS. 3A to 3D are a cross-sectional views illustrating the electronic control apparatus for a vehicle according to the exemplary embodiment of the present disclosure.

FIG. 3A is a view illustrating a cross section of a heat sink 60 to which a heat radiating pad 70 is inserted. As illustrated, a heat radiating pad insertion portion 61, which has a stepped portion formed to have a height that is smaller than that of one side surface to which the electronic control board 40 is coupled, is formed on a contact surface of the heat sink 60. A height t1 of the stepped portion is configured to be smaller than a thickness t2 of the heat radiating pad 70 such that pressing force is naturally generated by a coupling structure through the stepped portion when the electronic control board 40 is coupled to the heat sink 60.

Figure 3B:
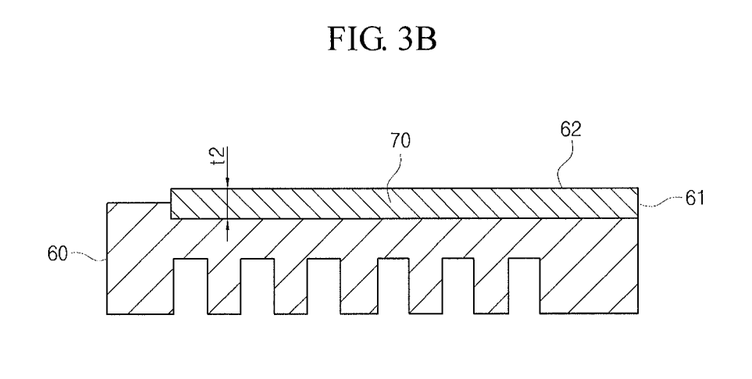

As illustrated in FIG. 3B, the heat radiating pad 70 is inserted to the contact surface of the heat sink 60 where the stepped portion t1 is formed. In this case, a thickness t2 of the heat radiating pad 70 may be configured to be slightly thicker than the stepped portion t1 formed on the contact surface of the heat sink 60.

Both surfaces of the heat radiating pad 70 has adhesive force such that the heat radiating pad 70 may be securely and tightly attached to the contact surface of the heat sink 60 and a bottom side of the electronic control board 40, but in the present exemplary embodiment, even though the heat radiating pad 70 does not have adhesive force, the heat radiating pad 70 may be securely and tightly attached to the contact surface of the heat sink 60 and the bottom side of the electronic control board 40 because pressing force is applied to the heat radiating pad 70. In order to more securely and tightly attach the heat radiating pad 70 to the bottom side of the electronic control board 40, only one surface (a heat radiating pad adhesion portion 62) of the heat radiating pad 70 may have adhesive force.

According to another exemplary embodiment of the present disclosure, liquid type glue or heat radiating paste having thermal conductivity may be used instead of the heat radiating pad 70. The liquid type glue may have high thermal conductivity and adhesive property. Even in the case in which the liquid type glue is used, the liquid type glue is applied on the surface of the heat radiating pad insertion portion 61 of the heat sink 60 at a predetermined thickness t2, and like the heat radiating pad 70, the height t1 of the stepped portion of the heat sink 60 is configured to be smaller than the thickness t2 of the heat radiating pad 70, such that pressing force is generated when the electronic control board 40 is coupled to the heat sink 60.

The pressing force is formed by the stepped portion such that the heat radiating pad or the liquid type glue has higher thermal conductivity.

Figure 3C:
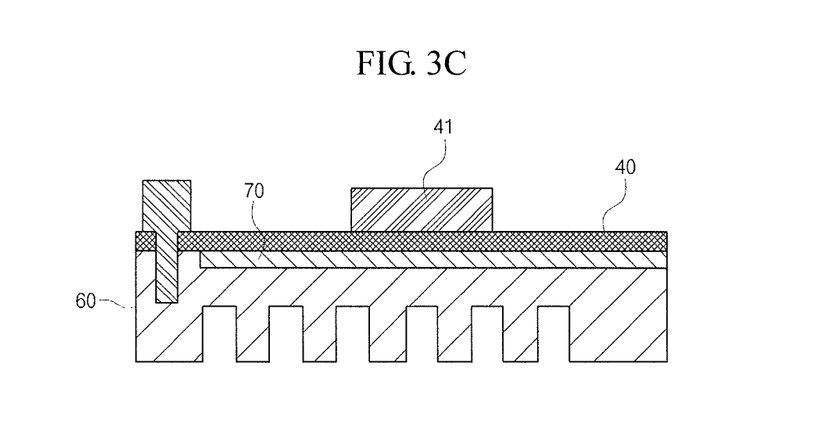

The heat radiating pad 70 is inserted to the contact surface of the heat sink 60, and thereafter, as illustrated in FIG. 3C, the heat sink 60 and the electronic control board 40 are fastened to each other by a connecting member such as the screw 43 or a clip, such that pressing force against the heat radiating pad 70 is formed.

In this case, thermal conductivity of the heat radiating pad 70 varies depending on an amount of pressing force. Therefore, in order to form pressing force that corresponds to optimum thermal conductivity of the heat radiating pad 70, the stepped portion t1 of the heat sink 60 may be designed in advance. The heat radiating pad 70 may be disposed between the heat sink 60 and the electronic control board 40 using an adhesive and pressing force against the one surface of the heat radiating pad 70, such that a screw fastening process in the related art may be omitted, and the number of screws, which are used in the electronic control apparatus, may be reduced.

Figure 3D:
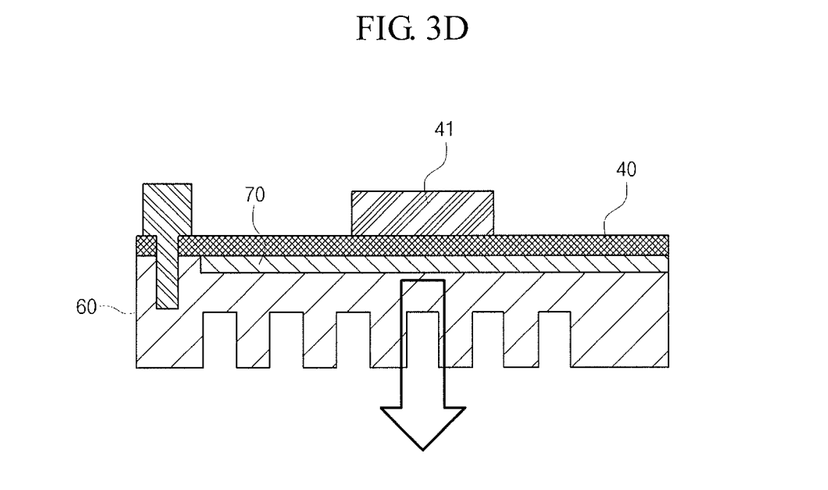

As shown in FIG. 3D, the heat generated by the heating elements 41 is conducted to the electronic control board 40 and the heat radiating pad 70, and conducted to hit sink 60 at a lower side, such that a heat radiating mechanism is formed.

Figure 4:
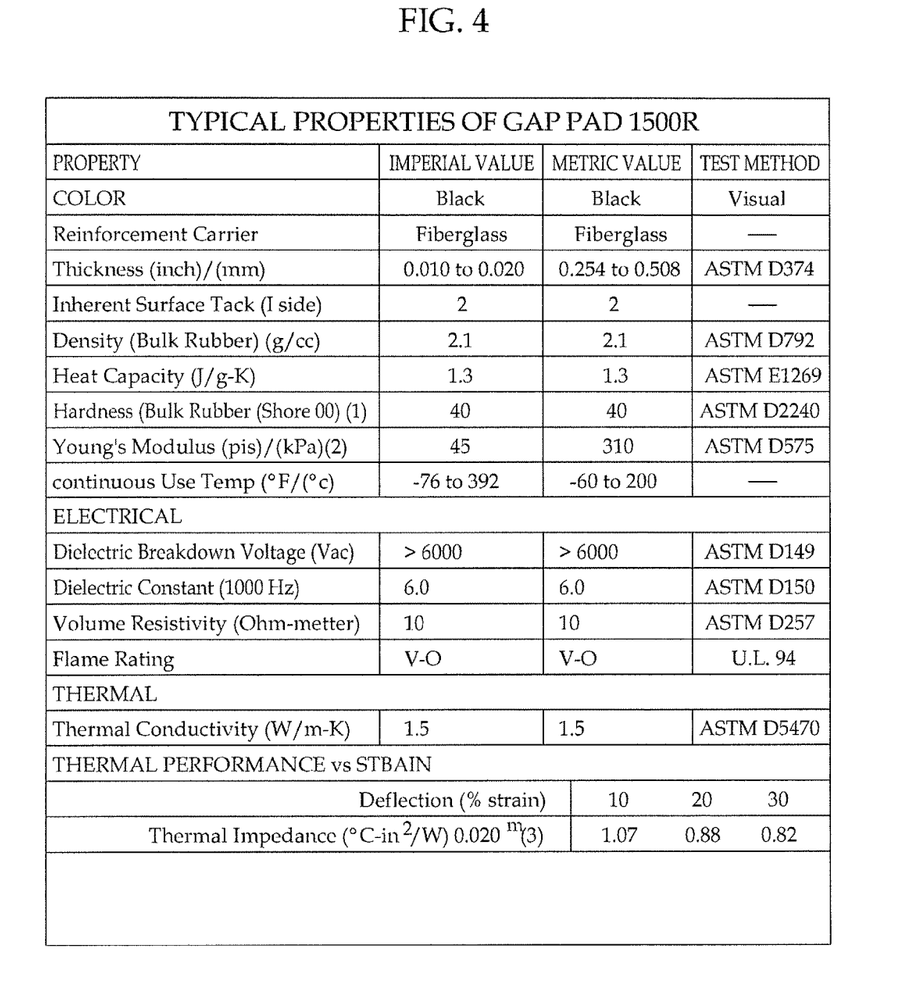
FIG. 4 is a reference view illustrating measured performance of the electronic control apparatus for a vehicle according to the exemplary embodiment of the present disclosure.

FIG. 4 is a reference view illustrating measured performance of the electronic control apparatus for a vehicle according to the exemplary embodiment of the present disclosure.

The heat radiating pad used to evaluate the performance is "Gap Pad 1500R", and it can be seen that when a deflection thickness is gradually decreased from "−10%" to "−20%" and "−30%", a thermal impedance value is gradually decreased from 1.07 to 0.88 and 0.82. Therefore, it can be seen that when the thickness of the heat radiating pad is decreased, the thermal impedance value is also decreased such that thermal conductivity becomes high. However, it can be seen that even though the thickness of the heat radiating pad is decreased, thermal conductivity is not rapidly increased, but there is a section in which thermal conductivity is saturated to a certain degree as illustrated in the performance measurement result of FIG. 4. Therefore, the stepped portion of the heat sink may be designed to have a pressing thickness having optimum thermal conductivity.

Figure 5:
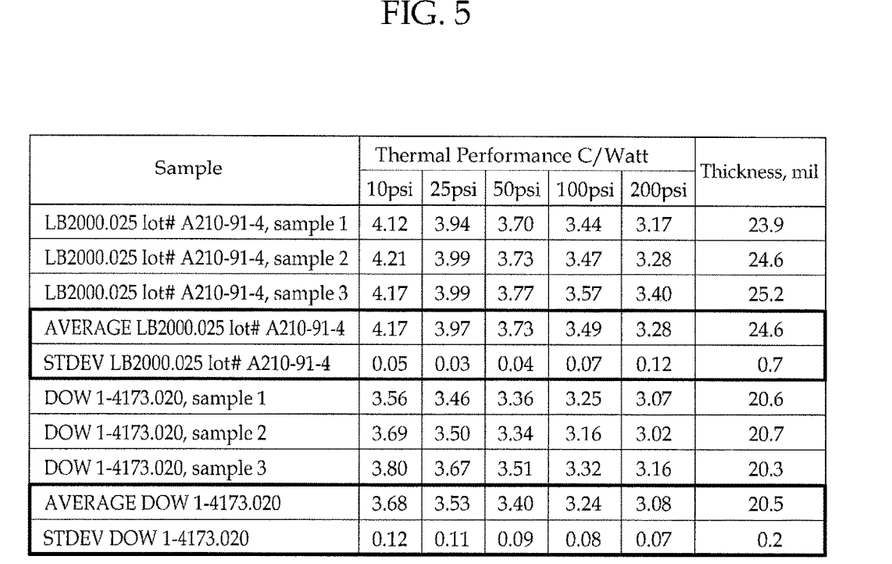
FIG. 5 is a reference view illustrating measured performance of an electronic control apparatus for a vehicle according to another exemplary embodiment of the present disclosure.

FIG. 5 is a reference view illustrating measured performance of an electronic control apparatus for a vehicle according to another exemplary embodiment of the present disclosure.

In the present exemplary embodiment, thermal conductivity according to pressing force was measured using liquid type heat radiating glue, and as the liquid type heat radiating glue used to evaluate the performance, thermal impedance according to pressing force are measured using three samples of "LB2000.025" and three samples of "DOW 1-4173.020".

As illustrated, as a result of measuring pressing force while gradually increasing the pressing force to five cases of 10 psi, 25 psi, 50 psi, 100 psi, and 200 psi, it can be seen that as the pressing force is increased, the thermal impedance value (C/watt) is gradually decreased. Therefore, it can be seen that when pressure applied to the liquid type heat radiating glue is increased, the thermal impedance value is also decreased such that thermal conductivity is increased. Therefore, like the case in which the heat radiating pad is used, the stepped portion of the heat sink may be designed to have a pressing thickness having optimum thermal conductivity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle comprising:
   an electronic control board which has a top side on which a heating element is mounted;
   a heat sink which is positioned on a bottom side of the electronic control board, absorbs heat generated from the heating element, and radiates the heat to the outside;
   at least one screw which couples the electronic control board and the heat sink; and
   a heat radiating pad which is inserted between the bottom side of the electronic control board and a contact surface of the heat sink, and transfers heat of the heating element to the heat sink,
   wherein the contact surface of the heat sink comprises a stepped portion having a predetermined height formed on the contact surface of the heat sink so that the heat radiating pad is inserted between the bottom side of the electronic control board and the contact surface of the heat sink, and
   wherein the height of the stepped portion of the heat sink is formed to be equal to a thickness of the heat radiating pad so that the heat radiating pad is inserted between the electronic control board and the heat sink when the electronic control board is coupled to the heat sink, such that sidewalls of the heat radiating pad are in contact with sidewalls of the stepped portion of the contact surface of the heat sink, and a contact surface between the electronic control board and the heat radiating pad and a contact surface between the electronic control board and the stepped portion are leveled by the electronic control board.

2. The electronic control apparatus of claim 1, wherein only one surface of the heat radiating pad has adhesive force.

3. An electronic control apparatus for a vehicle comprising:

an electronic control board which has a top side on which a heating element is mounted;

a heat sink which is positioned on a bottom side of the electronic control board, absorbs heat generated from the heating element, and radiates the heat to the outside;

at least one coupling member which couples the electronic control board and the heat sink; and a heat radiating member which is formed between the bottom side of the electronic control board and a contact surface of the heat sink, wherein the contact surface of the heat sink comprises a stepped portion having a predetermined height formed on the contact surface of the heat sink, which faces the bottom side of the electronic control board on which the heating element is positioned, so as to include the heat radiating member, and wherein the height of the stepped portion of the heat sink is formed to be equal to a thickness of the heat radiating member so that the heat radiating member is inserted between the electronic control board and the heat sink, such that sidewalls of the heat radiating member are in contact with sidewalls of the stepped portion of the contact surface of the heat sink, and a contact surface between the electronic control board and the heat radiating member and a contact surface between the electronic control board and the stepped portion are leveled by the electronic control board.

4. The electronic control apparatus of claim 3, wherein the coupling member is a screw or a clip.

5. The electronic control apparatus of claim 3, wherein the heat radiating member is heat radiating paste or liquid type glue.

* * * * *